(12) United States Patent
Du et al.

(10) Patent No.: US 12,364,102 B2
(45) Date of Patent: Jul. 15, 2025

(54) DISPLAY SUBSTRATE AND MANUFACTURING METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Chao Wu, Beijing (CN); Cong Liu, Beijing (CN); Weiyun Huang, Beijing (CN); Yue Long, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 636 days.

(21) Appl. No.: 17/626,461

(22) PCT Filed: Mar. 31, 2021

(86) PCT No.: PCT/CN2021/084426
§ 371 (c)(1),
(2) Date: Jan. 11, 2022

(87) PCT Pub. No.: WO2022/205074
PCT Pub. Date: Oct. 6, 2022

(65) Prior Publication Data
US 2023/0263027 A1    Aug. 17, 2023

(51) Int. Cl.
*H10K 59/121* (2023.01)
*H10K 59/35* (2023.01)
(Continued)

(52) U.S. Cl.
CPC ......... *H10K 59/121* (2023.02); *H10K 59/352* (2023.02); *H10K 59/353* (2023.02);
(Continued)

(58) Field of Classification Search
CPC .... H10K 59/353; H10K 59/131; H10K 59/65; H10K 59/352
See application file for complete search history.

(56) References Cited

U.S. PATENT DOCUMENTS

2017/0132965 A1* 5/2017 Hsu ................. G09G 3/2003
2020/0410921 A1   12/2020 Kim et al.
(Continued)

FOREIGN PATENT DOCUMENTS

| CN | 110379836 A | 10/2019 |
| CN | 111028692 A | 4/2020 |

(Continued)

OTHER PUBLICATIONS

English Translation of CN 112562518 (Year: 2021).*

*Primary Examiner* — Patrick N Edouard
*Assistant Examiner* — Eboni N Giles
(74) *Attorney, Agent, or Firm* — Intellectual Valley Law, P.C.

(57) ABSTRACT

A display substrate includes a main display area, a secondary display area and a transition area; the secondary display area includes an aperture region, a first peripheral region and a second peripheral region, at least part of the first peripheral region being located between the aperture region and the second peripheral region; the aperture region includes display sub-pixels; the first peripheral region includes display sub-pixels and first virtual sub-pixels; the second peripheral region includes display sub-pixels and second virtual sub-pixels; the density of the display sub-pixels of the aperture region, the density of the display sub-pixels of the first
(Continued)

peripheral region and the density of the display sub-pixels of the second peripheral region are the same; at least part of the transition area is located between the main display area and the second peripheral region; the main display area and the transition area both includes display sub-pixels.

18 Claims, 13 Drawing Sheets

(51) Int. Cl.
    *H10K 59/131*     (2023.01)
    *H10K 59/65*     (2023.01)
    *H10K 59/88*     (2023.01)

(52) U.S. Cl.
    CPC ........... *H10K 59/131* (2023.02); *H10K 59/65* (2023.02); *H10K 59/88* (2023.02)

(56) References Cited

U.S. PATENT DOCUMENTS

| | | |
|---|---|---|
| 2020/0411623 A1 | 12/2020 | Cui et al. |
| 2021/0065625 A1* | 3/2021 | Wang .................. G09G 3/2003 |
| 2021/0376011 A1 | 12/2021 | Liu et al. |
| 2022/0045159 A1* | 2/2022 | Lee ...................... H10K 59/121 |
| 2022/0069047 A1* | 3/2022 | Yang .................... H10K 59/131 |
| 2022/0157898 A1* | 5/2022 | Lou ..................... H10K 50/818 |

FOREIGN PATENT DOCUMENTS

| | | |
|---|---|---|
| CN | 111192902 A | 5/2020 |
| CN | 111211150 A | 5/2020 |
| CN | 111506157 A | 8/2020 |
| CN | 112562518 A | 3/2021 |

* cited by examiner

DISPLAY SUBSTRATE AND MANUFACTURING METHOD THEREOF AND DISPLAY DEVICE

CROSS-REFERENCE TO RELATED APPLICATION

The present application is the U.S. national phase of PCT Application No. PCT/CN2021/084426 filed on Mar. 31, 2021, which is incorporated herein by reference in its entirety.

TECHNICAL FIELD

The present disclosure relates to the field of display technology, and more particularly to a display substrate and a manufacturing method thereof, and a display device.

BACKGROUND

As consumers continue to pursue the visual effect of display products, extremely narrow frame or even full-screen display has become a new trend of organic light emitting diode display products. The most key problem of full-screen display is how to deal with the front camera. In order to achieve a higher screen-to-body ratio, notch screen, water drop screen, dig hole screen and so on have appeared one after another. Although these all screens have increased the screen-to-body ratio, the appearance of products has dropped a lot. With overall consideration, the under-screen camera is the best form for full-screen display. The under-screen camera refers to that the front camera is located below the screen but does not affect the screen display function. When the front camera is not used, the screen above the front camera can still display images normally. Therefore, in terms of appearance, the under-screen camera does not have any camera hole, and a full-screen display effect is actually achieved.

SUMMARY

The purpose of the present disclosure is to provide a display substrate, a manufacturing method thereof, and a display device.

To achieve the above purpose, the present disclosure provides the following technical solutions:

a first aspect of the present disclosure provides a display substrate including a main display area, a secondary display area, and a transition area; the secondary display area includes an aperture region, a first peripheral region and a second peripheral region, and at least part of the first peripheral region is located between the aperture region and the second peripheral region;

the aperture region includes a display sub-pixel; the first peripheral region includes a display sub-pixel and a first virtual sub-pixel; the second peripheral region includes a display sub-pixel and a second virtual sub-pixel; the density of the display sub-pixels of the aperture region, the density of the display sub-pixels of the first peripheral region and the density of the display sub-pixels of the second peripheral region are the same; and at least part of the transition area is located between the main display area and the second peripheral region; the main display area and the transition area both include display sub-pixels, the density of the display sub-pixels of the transition area is less than the density of the display sub-pixels of the main display area, and the density of the display sub-pixels of the transition area is greater than the density of the display sub-pixels of the secondary display area.

Alternatively, the first peripheral region surrounds at least part of the aperture region;

the second peripheral region includes a first sub-region and a second sub-region oppositely arranged along a first direction, and the first peripheral region is located between the first sub-region and the second sub-region; and at least part of the transition area is located between the main display area and the first peripheral region.

Alternatively, the second peripheral region surrounds the aperture region and the first peripheral region.

Alternatively, along a second direction, the main display area is located at one side of the secondary display area, and the second direction intersects the first direction.

Alternatively, the main display area surrounds the secondary display area.

Alternatively, the display substrate further includes a plurality of scanning lines and a plurality of data lines; at least part of the scanning line extends along the first direction, and at least part of the data line extends along the second direction, and the second direction intersects with the first direction;

a display sub-pixel of the main display area includes a main anode pattern, and a sub-pixel driving circuit coupled to the main anode pattern;

a display sub-pixel of the transition area includes a transition anode pattern, and at least one sub-pixel driving circuit coupled to the transition anode pattern; and a display sub-pixel of the second peripheral region includes a second anode pattern, and at least one sub-pixel driving circuit coupled to the second anode pattern.

Alternatively, the display sub-pixel of the transition area includes two sub-pixel driving circuits respectively coupled to the transition anode pattern, the two sub-pixel driving circuits are respectively coupled to the same scanning line, and the two sub-pixel driving circuits are respectively coupled to the same data line.

Alternatively, the display sub-pixel of the second peripheral region includes two sub-pixel driving circuits respectively coupled to the second anode pattern, the two sub-pixel driving circuits are respectively coupled to the same scanning line, and the two sub-pixel driving circuits are respectively coupled to the same data line.

Alternatively, the second peripheral region is provided with a plurality of compensation data lines; the second virtual sub-pixel includes a second virtual anode pattern, and two sub-pixel driving circuits respectively coupled to the second virtual anode pattern, wherein the two sub-pixel driving circuits are respectively coupled to the same scanning line, and the two sub-pixel driving circuits are respectively coupled to the same compensation data line.

Alternatively, the display sub-pixel of the aperture region includes an aperture region anode pattern, the aperture region anode pattern have a one-to-one correspondence with the second virtual anode pattern described in the first part, and the aperture region anode pattern is coupled to the corresponding second virtual anode pattern by a corresponding first conductive connection part.

Alternatively, the display sub-pixel of the aperture region and the second virtual sub-pixel of the second peripheral region are divided into a plurality of rows of sub-pixels, and each row of sub-pixels includes at least one display sub-pixel located in the aperture region and a plurality of the second virtual sub-pixels; and the corresponding aperture region anode pattern and the second virtual anode pattern belong to the same row of sub-pixels.

Alternatively, the display sub-pixel of the first peripheral region includes a first anode pattern, the first anode pattern have a one-to-one correspondence with the second virtual anode pattern described in the second part, and the first anode pattern is coupled to the corresponding second virtual anode pattern by a corresponding first conductive connection part.

Alternatively, the display sub-pixel of the first peripheral region and the second virtual sub-pixel of the second peripheral region are divided into a plurality of rows of sub-pixels, and each row of sub-pixels includes at least one display sub-pixel located in the first peripheral region and a plurality of the second virtual sub-pixels; and the corresponding first anode pattern and the second virtual anode pattern belong to the same row of sub-pixels.

Alternatively, the plurality of data lines includes a plurality of first data lines;

the display sub-pixels of the aperture region and the display sub-pixels of the first peripheral region are divided into a plurality of first sub-pixel columns, and the plurality of first sub-pixel columns have a one-to-one correspondence with the plurality of first data lines;

the second virtual sub-pixels of the second peripheral region are divided into a plurality of second sub-pixel columns, and at least part of the plurality of second sub-pixel columns have a one-to-one correspondence with the plurality of compensation data lines; and in the correspondingly coupled aperture region anode pattern and the second virtual anode pattern, a first data line corresponding to a first sub-pixel column to which the aperture region anode pattern belongs is coupled to a compensation data line corresponding to a second sub-pixel column to which the second virtual anode pattern belongs.

Alternatively, in the correspondingly coupled first anode pattern and the second virtual anode pattern, a first data line corresponding to a first sub-pixel column to which the first anode pattern belongs is coupled to a compensation data line corresponding to a second sub-pixel column to which the second virtual anode pattern belongs.

Alternatively, the first data line includes a straight edge portion and a curved edge portion, and at least part of the straight edge portion is located in the main display area, and the curved edge portion is located in the first peripheral region, and at least part of the curved edge portion extends along part of the boundary of the aperture region.

Alternatively, the first conductive connection part is arranged in different layers with the second virtual anode pattern.

Alternatively, the display sub-pixel of the first peripheral region includes a first anode pattern, and two sub-pixel driving circuits respectively coupled to the first anode pattern, and the two sub-pixel driving circuits are respectively coupled to the same scanning line, and the two sub-pixel driving circuits are respectively coupled to the same data line.

Alternatively, the display substrate further includes:

a first power pattern having a mesh shape, the first power pattern including a portion located in the main display area; and a second power pattern having a mesh shape, the second power pattern including a portion located in the first peripheral region, a portion located in the second peripheral region, and a portion located in the transition area.

Alternatively, the density of the display sub-pixels of the transition area is twice the density of the display sub-pixels of the secondary display area and the density of the display sub-pixels of the main display area is twice the density of the display sub-pixels of the transition area.

Alternatively, the display sub-pixel of the transition area, the display sub-pixel of the aperture region, the display sub-pixel of the first peripheral region, and the display sub-pixel of the second peripheral region each include a first pixel opening, and the orthographic projection of the first pixel opening on the base of the display substrate is an ellipse with notched edges.

Alternatively, the display sub-pixel of the main display area includes a second pixel opening, the orthographic projection of the second pixel opening on the base of the display substrate is a pentagon or a hexagon.

A second aspect of the present disclosure provides a display device including the above display substrate.

A third aspect of the present disclosure provides a manufacturing method of a display substrate, wherein the display substrate includes a main display area, a secondary display area, and a transition area; the secondary display area includes an aperture region, a first peripheral region and a second peripheral region, and at least part of the first peripheral region is located between the aperture region and the second peripheral region; and the manufacturing method includes:

manufacturing a display sub-pixel in the aperture region; manufacturing a display sub-pixel and a first virtual sub-pixel in the first peripheral region; manufacturing a display sub-pixel and a second virtual sub-pixel in the second peripheral region; the density of the display sub-pixels of the aperture region, the density of the display sub-pixels of the first peripheral region and the density of the display sub-pixels of the second peripheral region being the same; and at least part of the transition area being located between the main display area and the second peripheral region; the main display area and the transition area each including a display sub-pixel, and the density of the display sub-pixels of the transition area being less than the density of the display sub-pixels of the main display area, and the density of the display sub-pixels of the transition area being greater than the density of the display sub-pixels of the secondary display area.

BRIEF DESCRIPTION OF THE DRAWINGS

The accompanying drawings illustrated here are used to provide a further understanding of the present disclosure and constitute a part of the present disclosure. The illustrative embodiments of the present disclosure and their descriptions are used to explain the present disclosure, and do not constitute undue restrictions on the present disclosure. In the drawings.

DETAILED DESCRIPTION

Figure 1:
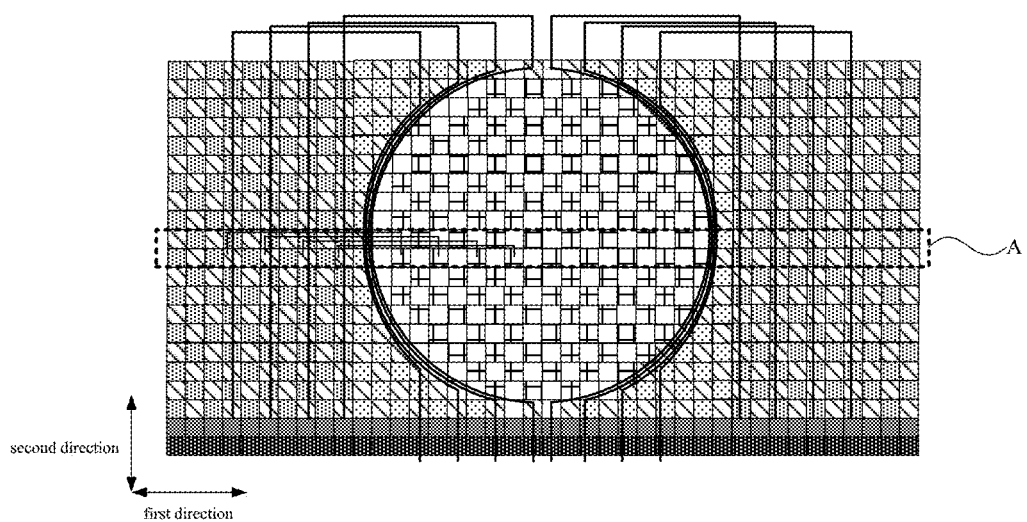
FIG. 1 is a schematic diagram showing the layout of regions in a display panel according to an embodiment of the present disclosure.

In order to further illustrate the display substrate and the manufacturing method thereof and the display device provided by the embodiments of the present disclosure, a detailed description will be given below with reference to the accompanying drawings.

The present disclosure provides a display substrate using the technology of full display with camera (FDC), wherein the display substrate includes a main display area and a secondary display area, and the secondary display area is provided with an aperture region, and the aperture region is used for providing a camera structure; and both the main display area and the secondary display area are provided with display sub-pixels, and the density of the display sub-pixels of the secondary display area is less than the density of the display sub-pixels of the main display area.

Although the above-mentioned display substrate realizes the full display with camera (FDC) and ensures the aesthetics of the display products, the difference between the density of the display sub-pixels of the secondary display area and the density of the display sub-pixels of the main display area is large, resulting in the display brightness and the current of the secondary display area at least twice lower than the display brightness and the current of the main display area. At the boundary of the secondary display area and the main display area, the difference in light brightness is relatively noticeable, affecting the display performance of the display substrate.

Referring to FIGS. 1, 2, 5, 7 and 8, an embodiment of the present disclosure provides a display substrate including a main display area 10, a secondary display area 20, and a transition area 30. The secondary display area 20 includes an aperture region 201, a first peripheral region 202 and a second peripheral region 203, and at least part of the first peripheral region 202 is located between the aperture region 201 and the second peripheral region 203.

The aperture region 201 includes a display sub-pixel 40; the first peripheral region 202 includes a display sub-pixel 40 and a first virtual sub-pixel 41. The second peripheral region 203 includes a display sub-pixel 40 and a second virtual sub-pixel 42. The density of the display sub-pixels 40 of the aperture region 201, the density of the display sub-pixels 40 of the first peripheral region 202 and the density of the display sub-pixels 40 of the second peripheral region 203 are the same.

At least part of the transition area 30 is located between the main display area 10 and the second peripheral region 203. The main display area 10 and the transition area 30 both include display sub-pixels 40, the density of the display sub-pixels 40 of the transition area 30 is less than the density of the display sub-pixels 40 of the main display area 10, and the density of the display sub-pixels 40 of the transition area 30 is greater than the density of the display sub-pixels 40 of the secondary display area 20.

Illustratively, the display substrate has a square shape, including an upper frame, a lower frame, a left frame, and a right frame. The secondary display area 20 is integrally located at a position close to the upper frame, or the secondary display area 20 is integrally located at a position close to the upper left corner of the display substrate, or the secondary display area 20 is integrally located at a position close to the upper right corner of the display substrate. Illustratively, in the whole display interface of the display substrate, the main display area 10 is complementary to the secondary display area 20, namely, in the whole display interface, all the remaining areas except the area where the secondary display area 20 is located are the main display area 10.

Illustratively, the main display area 10 is used as the main display area of a display substrate for realizing the main display function of the display substrate, for example: displaying images, and displaying video pictures, etc. The secondary display area 20 serves as the secondary display area of a display substrate, and the secondary display area 20 can fit the main display area 10 to complete the display of a full picture and a full video, and can also independently display time, mobile network connection situation and electric quantity, etc.

Illustratively, the secondary display area 20 includes an aperture region 201, and the orthographic projection of the aperture region 201 on the base of the display substrate is a circle or an ellipse. Illustratively, the display substrate includes a camera structure, such as a camera; and the camera structure is disposed within the aperture region.

Figure 12:
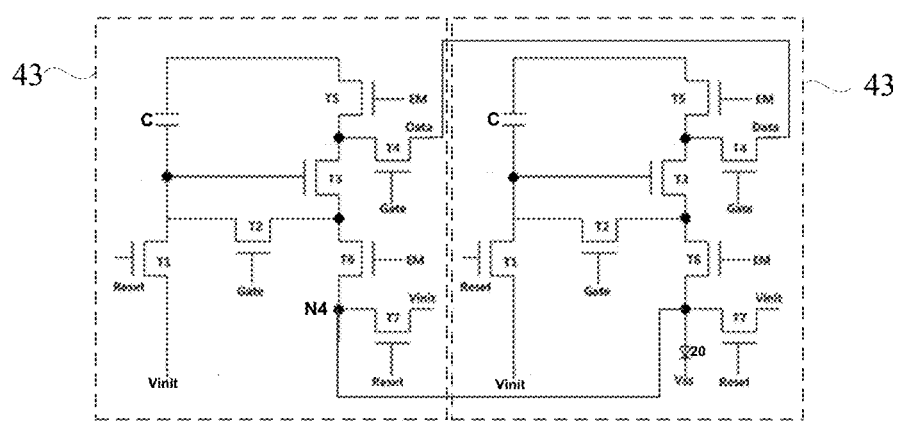
FIG. 12 is a schematic structural diagram of a dual 7T1C sub-pixel driving circuit according to an embodiment of the present disclosure.
Figure 13:
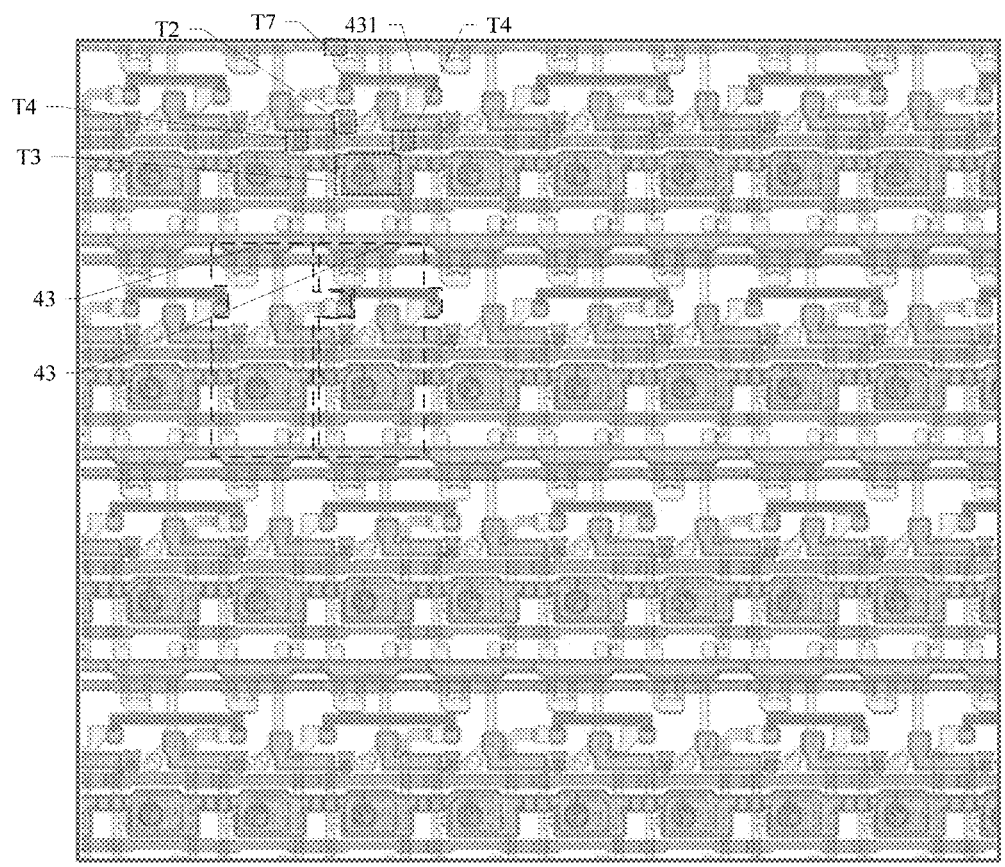
FIG. 13 is a schematic diagram showing the layout of a dual 7T1C sub-pixel driving circuit according to an embodiment of the present disclosure.
Figure 14:
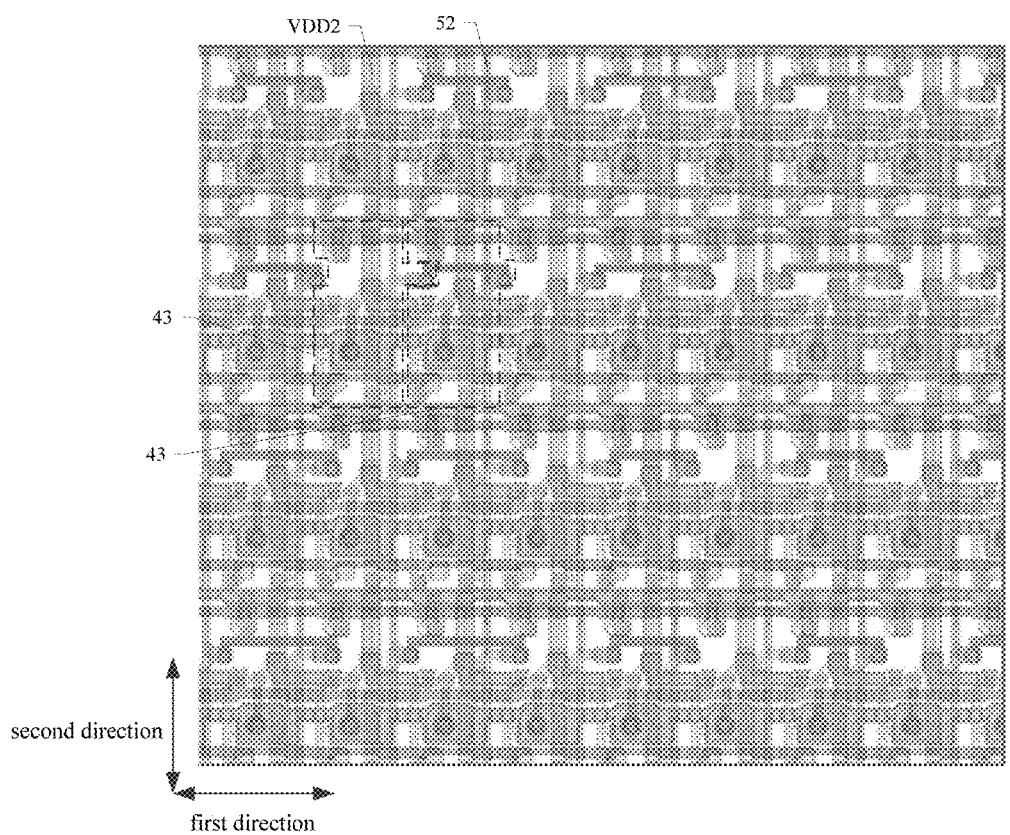
FIG. 14 is a schematic diagram showing a dual 7T1C sub-pixel driving circuit coupled to a data line according to an embodiment of the present disclosure.

Illustratively, as shown in FIGS. 12 to 14, the aperture region 201 includes the display sub-pixel 40, and the display sub-pixel 40 located in the aperture region 201 includes only the aperture region anode pattern and does not include the sub-pixel driving circuit 43. Since the aperture region anode pattern can transmit light, and the aperture region is not blocked by the sub-pixel driving circuit 43, thus the collection of light of the camera structure located in the aperture region is well ensured, and the photographing quality of the camera structure is ensured.

Illustratively, the density of the display sub-pixels 40 of the aperture region 201, the density of the display sub-pixels 40 of the first peripheral region 202, and the density of the display sub-pixels 40 of the second peripheral region 203 are the same, ensuring the uniformity of the display brightness of the secondary display area 20, such that there is no noticeable brightness difference at the boundary between the aperture region, the first peripheral region 202 and the second peripheral region 203.

Illustratively, the main display area 10 is also referred to as a high PPI display area, and the secondary display area 20 is also referred to as a low PPI display area, and the aperture region 201 is also referred to as a camera area.

Illustratively, the first virtual sub-pixel 41 and the second virtual sub-pixel 42 each include an anode pattern, the pixel defining layer on the side of the anode pattern back to the substrate does not form a pixel opening, and the first virtual sub-pixel 41 and the second virtual sub-pixel 42 do not emit light.

Illustratively, the aperture of the aperture region is about 3 mm. illustratively, the aperture region and the first peripheral region together include 48 rows by 48 columns of sub-pixels (including display sub-pixels and first virtual sub-pixels). Illustratively, the first sub-region in the second peripheral region includes 48 rows by 24 columns of sub-pixels (including display sub-pixels and first virtual sub-pixels). Illustratively, the second sub-region in the second peripheral region includes 48 rows by 24 columns of sub-pixels (including display sub-pixels and first virtual sub-pixels).

Illustratively, the transition area 30 includes two (2) to four (4) rows of display sub-pixels.

Illustratively, the width of the second peripheral region along the first direction is between 3 mm and 4 mm and may include endpoint values. Illustratively, the width of the first sub-region in the second peripheral region along the first direction is between 1.5 mm and 2 mm and may include endpoint values. Illustratively, the width of the second sub-region in the second peripheral region along the first direction is between 1.5 mm and 2 mm and may include endpoint values.

According to the above-mentioned detailed structure of the display substrate, it can be seen that in the display substrate provided in the embodiments of the present disclosure, by arranging that at least part of the transition area 30 located between the main display area 10 and the second peripheral region 203, the density of the display sub-pixels 40 of the transition area 30 is less than the density of the display sub-pixels 40 of the main display area 10, and the density of the display sub-pixels 40 of the transition area 30 is greater than the density of the display sub-pixels 40 of the secondary display area 20, a display brightness transition region is formed between the main display area 10 and the secondary display area 20 and the problem that the difference in light brightness is noticeable at the boundary of the secondary display area 20 and the main display area 10 is improved, therefore the display substrate achieves a more uniform and transitional full-screen visual display effect, and achieves a better full-screen display effect and user experience.

Figure 2:
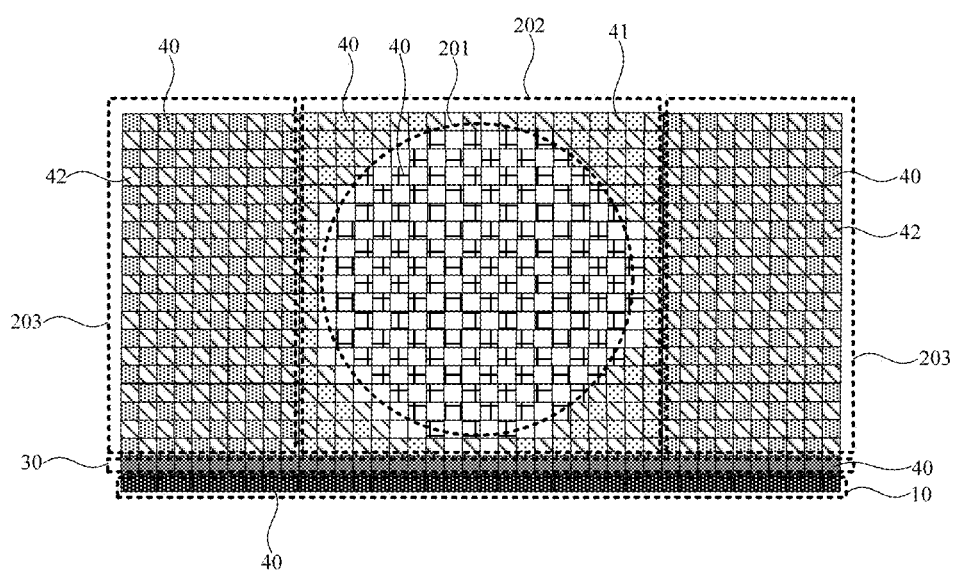
FIG. 2 is a schematic diagram showing the division of each region and the layout of sub-pixels in FIG. 1.

As shown in FIGS. 1 and 2, in some embodiments, the first peripheral region 202 is disposed to surround at least part of the aperture region 201;
the second peripheral region 203 includes a first sub-region (as shown in the dashed box on the left in FIG. 2) oppositely arranged along a first direction and a second sub-region (as shown in the dashed box on the right in FIG. 2), and the first peripheral region 202 is located between the first sub-region and the second sub-region; and
at least part of the transition area 30 is located between the main display area 10 and the first peripheral region 202.

Illustratively, the first peripheral region 202 completely surrounds the aperture region 210.

Illustratively, the orthographic projection of the outer boundary of the first peripheral region 202 on the base of the display substrate is rectangular.

Illustratively, the second peripheral region 203 includes a first sub-region and a second sub-region oppositely arranged along a first direction, and the first peripheral region 202 and the aperture region are both located between the first sub-region and the second sub-region. Illustratively, both the orthographic projection of the first sub-region on the substrate and the orthographic projection of the second sub-region on the substrate are rectangular.

Illustratively, the transition area 30 includes a portion between the main display area 10 and the first peripheral region 202, and the transition area 30 also includes a portion between the main display area 10 and the second peripheral region 203.

Illustratively, the first peripheral region 202 surrounds a portion of the aperture region; and the transition area 30 includes a portion between the main display area 10 and the first peripheral region 202, the transition area 30 further includes a portion between the main display area 10 and the second peripheral region 203, and the transition area 30 further includes a portion between the portion and the main display area 10.

In the above-mentioned arrangement, the problem of a relatively noticeable difference in light brightness at the boundary of the first peripheral region 202 and the main display area 10, at the boundary of the second peripheral region 203 and the main display area 10, and at the boundary of the aperture region and the main display area 10 is effectively improved, thereby enabling the display substrate to realize a more uniform transition of full-screen visual display effect.

In some embodiments, the second peripheral region 203 surrounds the aperture region 201 and the first peripheral region 202.

By arranging the second peripheral region 203 to surround the aperture region and the first peripheral region 202, and arranging at least part of the transition area 30 located between the main display area 10 and the second peripheral region 203, the problem of a relatively noticeable difference in light brightness at the boundary of the secondary display area 20 and the main display area 10 is well improved, thereby enabling the display substrate to realize a more uniform transition of full-screen visual display effect.

In some embodiments, along a second direction, the main display area 10 is located at one side of the secondary display area 20, and the second direction intersects the first direction.

Illustratively, the first direction includes a horizontal direction and the second direction includes a vertical direction. Illustratively, the first direction is an extending direction of one of a data line and a scanning line in the display substrate, and the second direction is an extending direction of the other of the data line and the scanning line.

Illustratively, along a second direction, the main display area 10 is located at one side of the secondary display area 20 (including the aperture region, the first peripheral region 202 and the second peripheral region 203).

In some embodiments, the main display area 10 surrounds the secondary display area 20.

Illustratively, the main display area 10 surrounds the aperture region, the first peripheral region 202 and the second peripheral region 203.

Figure 8:
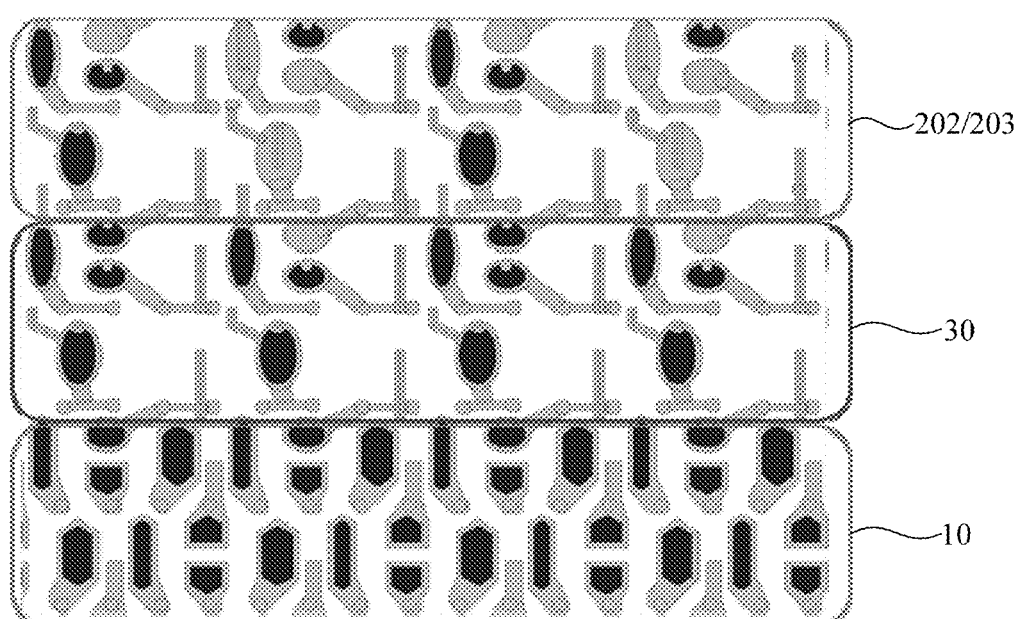
FIG. 8 is a schematic diagram showing the layout of display sub-pixels of each region according to an embodiment of the present disclosure.
Figure 9:
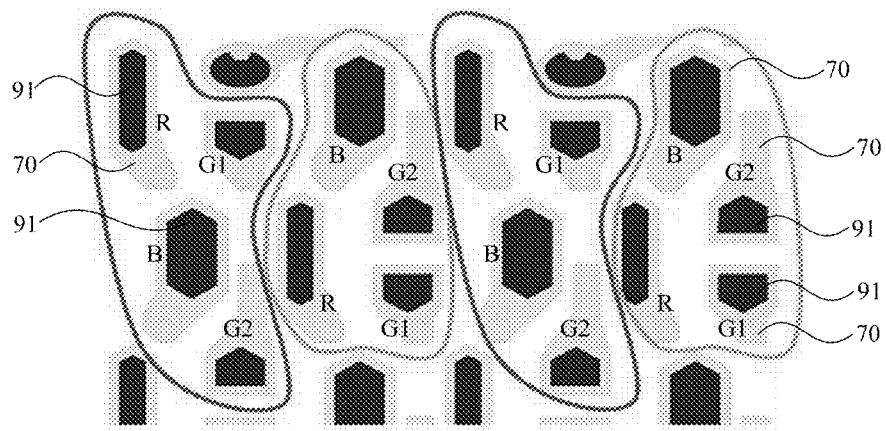
FIG. 9 is a schematic diagram showing the layout of display sub-pixels of main display area according to an embodiment of the present disclosure.
Figure 10:
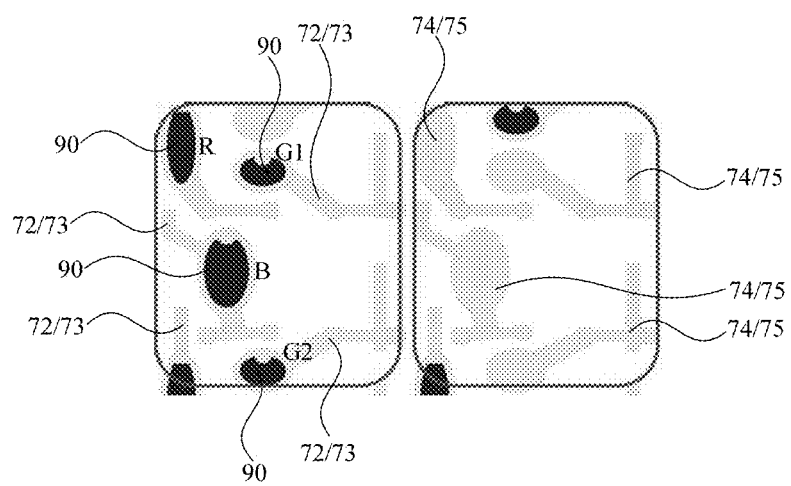
FIG. 10 is a schematic diagram showing the layout of sub-pixels of a first peripheral region and a second peripheral region according to an embodiment of the present disclosure.
Figure 11:
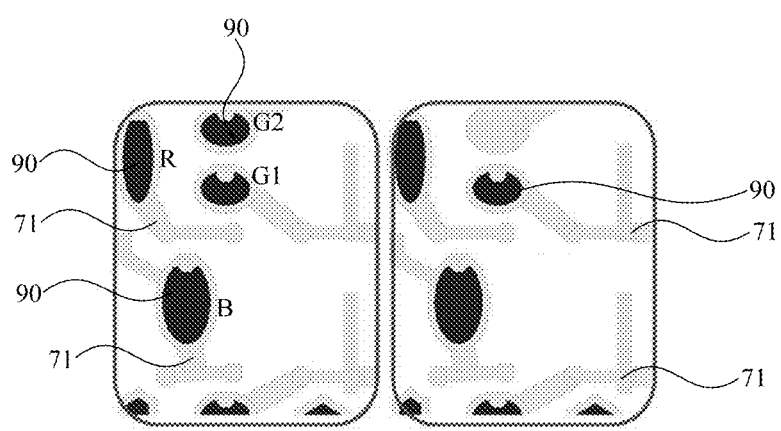
FIG. 11 is a schematic diagram showing the layout of display sub-pixels of a transition area according to an embodiment of the present disclosure.

As shown in FIG. 14, in some embodiments, the display substrate further includes a plurality of scanning lines and a plurality of data lines 52; at least part of the scanning line extends along the first direction, and at least part of the data line 52 extends along the second direction, and the second direction intersects with the first direction;

As shown in FIGS. 8 and 9, a display sub-pixel 40 of the main display area 10 includes a main anode pattern 70, and a sub-pixel driving circuit 43 coupled to the main anode pattern 70;

As shown in FIGS. 8 and 11, a display sub-pixel 40 of the transition area 30 includes a transition anode pattern 71, and at least one sub-pixel driving circuit 43 coupled to the transition anode pattern 71; and As shown in FIGS. 8 and 10, a display sub-pixel 40 of the second peripheral region 203 includes a second anode pattern 73, and at least one sub-pixel driving circuit 43 coupled to the second anode pattern 73.

Illustratively, the main display area 10 includes a plurality of display sub-pixels 40 including a main anode pattern 70, and a sub-pixel driving circuit 43 coupled to the main anode pattern 70 for providing driving signals to the main anode pattern 70. Illustratively, the plurality of display sub-pixels 40 include a plurality of sub-pixel driving circuits 43 distributed in an array, which can be divided into a plurality of rows of sub-pixel driving circuits 43 and a plurality of columns of sub-pixel driving circuits 43. Illustratively, the sub-pixel driving circuit 43 includes a 7T1C structure, i.e., includes seven (7) thin film transistors and one (1) capacitor.

As shown in FIGS. 8 and 9, illustratively, the main display area 10 includes a plurality of display sub-pixels 40 divided into a plurality of pixel units each including one red sub-pixel R, one blue sub-pixel B, and two green sub-pixels G1/G2. Illustratively, the main anode patterns 70 included in the plurality of pixel units in the main display area 10 are distributed in an array.

As shown in FIGS. 8 and 9, illustratively, the display sub-pixel 40 of the main display area 10 includes a second pixel opening 91, the orthographic projection of the second pixel opening 91 on the base of the display substrate is a pentagon or a hexagon. Illustratively, the red sub-pixel and the blue sub-pixel include a second pixel opening 91 that is hexagonal and the two green sub-pixels include a second pixel opening 91 that is pentagonal. Illustratively, the second pixel opening 91 is formed by a pixel defining layer in the display substrate.

Illustratively, as shown in FIG. 9, the arrangement of each sub-pixel in the pixel unit in the main display area 10 includes: R/G1/B/G2 and B/G2/R/G1 appeared alternately, presenting a cyclic design.

Illustratively, as shown in FIG. 11, the transition area 30 includes a plurality of display sub-pixels 40 divided into a plurality of pixel units each including one red sub-pixel R, one blue sub-pixel B, and two green sub-pixels G1/G2. Illustratively, the transition anode patterns 71 included in the plurality of pixel units in the transition area 30 are distributed in an array.

Illustratively, as shown in FIG. 10, the second peripheral region 203 includes a plurality of display sub-pixels 40 divided into a plurality of pixel units each including one red sub-pixel R, one blue sub-pixel B, and two green sub-pixels G1/G2. Illustratively, the second anode pattern 73 included in the plurality of pixel units in the second peripheral region 203 are distributed in an array.

Illustratively, as shown in FIGS. 8, 10 and 11, the display sub-pixel 40 of the transition area 30, the display sub-pixel 40 of the aperture region, the display sub-pixel 40 of the first peripheral region 202, and the display sub-pixel 40 of the second peripheral region 203 each include a first pixel opening 90, and the orthographic projection of the first pixel opening 90 on the base of the display substrate is an ellipse with notched edges. The first pixel opening 90 is formed by the pixel defining layer (PDL).

Illustratively, in the display sub-pixels 40 of the same color included in the transition area 30 and the second peripheral region 203: the transition anode pattern 71 of the display sub-pixel 40 located at the transition area 30 has the same shape as the second anode pattern 73 of the display sub-pixel 40 located at the second peripheral region 203, and the first pixel opening 90 of the display sub-pixel 40 located at the transition area 30 has the same shape as the first pixel opening 90 of the display sub-pixel 40 located at the second peripheral region 203.

Illustratively, the transition area 30 does not include a virtual sub-pixel.

Figure 7:
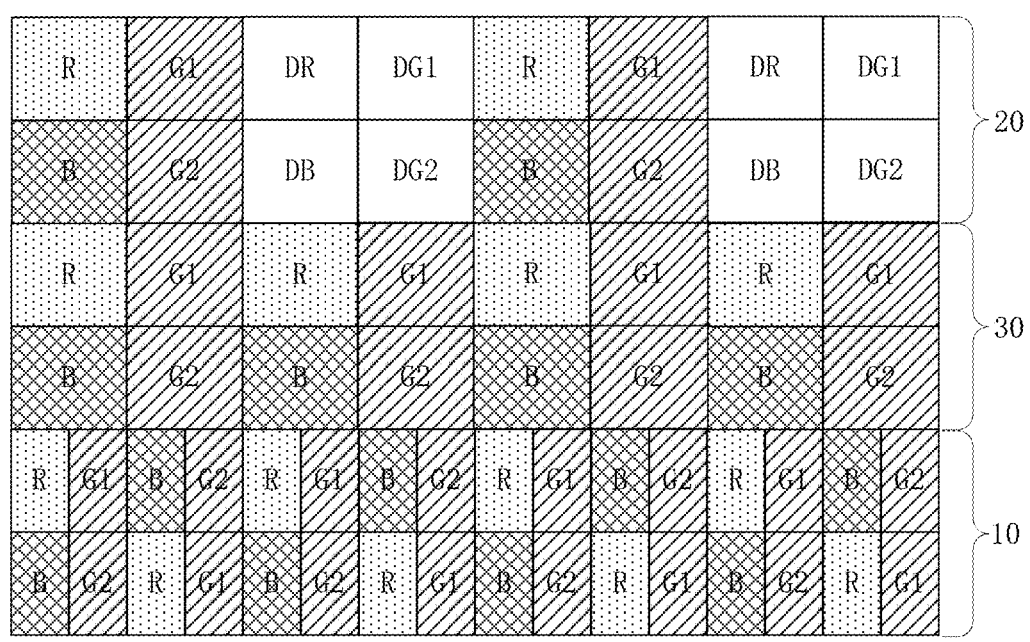
FIG. 7 is a schematic diagram showing sub-pixel densities of each region according to an embodiment of the present disclosure.

Illustratively, as shown in FIGS. 7 and 8, the density of the display sub-pixels 40 of the transition area 30 is twice the density of the display sub-pixels 40 of the secondary display area 20 and the density of the display sub-pixels 40 of the main display area 10 is twice the density of the display sub-pixels 40 of the transition area 30. Note that DR in FIG. 7 represents a red virtual sub-pixel, DB represents a blue virtual sub-pixel, and DG1 and DG2 represent green virtual sub-pixels.

As shown in FIGS. 11 to 14, in some embodiments, the display sub-pixel 40 of the transition area 30 includes two sub-pixel driving circuits 43 respectively coupled to the transition anode pattern 71, the two sub-pixel driving circuits 43 respectively coupled to the same scanning line, and the two sub-pixel driving circuits 43 respectively coupled to the same data line.

Illustratively, the display sub-pixel 40 of the transition area 30 includes a transition anode pattern 71, and two sub-pixel driving circuits 43 respectively coupled to the transition anode pattern 71, such as: two 7T1C circuits. Illustratively, the two sub-pixel driving circuits 43 are arranged along the first direction; alternatively, the two sub-pixel driving circuits 43 are arranged along the second direction.

Illustratively, the 7T1C circuit includes a first transistor T1, a second transistor T2, a third transistor T3, a fourth transistor T4, a fifth transistor T5, a sixth transistor T6, a seventh transistor T7 and a capacitor C. A gate electrode of the first transistor T1 receives a reset signal Reset, a first electrode of the first transistor T1 receives an initialization signal Vinit, a gate electrode of the second transistor T2 receives a scanning signal Gate, a gate electrode of the fourth transistor T4 receives a scanning signal Gate, a first electrode of the fourth transistor T4 receives a data signal, gates of the fifth transistor T5 and the sixth transistor T6 receive a light-emitting control signal EM, a gate electrode of the seventh transistor T7 receives a reset signal Reset, and a first electrode of the seventh transistor receives an initialization signal Vinit.

Illustratively, the N4 nodes of the two 7T1C are electrically connected, and the first electrode of the fourth transistor T4 is electrically connected via a connection part 431.

Illustratively, as shown in FIG. 14, sub-pixel driving circuits 43 included in each display sub-pixel 40 in the transition area 30 are distributed in an array; all the sub-pixel driving circuits 43 in the transition area 30 can be divided into a plurality of rows of sub-pixel driving circuits 43 and a plurality of columns of sub-pixel driving circuits 43; each row of sub-pixel driving circuits 43 shares the same scanning line; a plurality of columns of sub-pixel driving circuits 43 are divided into a plurality of groups of sub-pixel driving circuit 43 columns; each group of sub-pixel driving circuit 43 columns shares the same data line 52; each group of sub-pixel driving circuit 43 columns includes two columns of sub-pixel driving circuits 43, and in each group of sub-pixel driving circuit 43 columns, two sub-pixel driving circuits 43 located in the same row belong to the same display sub-pixel 40.

Illustratively, a plurality of groups of sub-pixel driving circuit 43 columns in the transition area 30 have a one-to-one correspondence with some sub-pixel driving circuit 43 columns in the main display area 10, and each group of sub-pixel driving circuit 43 columns shares the same data line with a corresponding sub-pixel driving circuit 43 column in the main display area 10.

In the display substrate provided in the above-mentioned embodiment, by arranging the display sub-pixel 40 of the transition area 30 to include two sub-pixel driving circuits 43 respectively coupled to the transition anode pattern 71, a dual driving circuit drive of the display sub-pixel 40 of the transition area 30 is realized, the light brightness of the transition area 30 is closer to the light brightness of the main display area 10, reducing the brightness difference between the transition area 30 and the main display area 10, and making the transition effect more uniform.

As shown in FIGS. 2, 8, 10 and FIGS. 12 to 14, in some embodiments, the display sub-pixel 40 of the second peripheral region 203 includes two sub-pixel driving circuits 43 respectively coupled to the second anode pattern 73, the two sub-pixel driving circuits 43 respectively coupled to the same scanning line, and the two sub-pixel driving circuits 43 respectively coupled to the same data line.

Illustratively, the display sub-pixel 40 of the second peripheral region 203 includes a second anode pattern 73, and two sub-pixel driving circuits 43 respectively coupled to the second anode pattern 73, such as: two 7T1C circuits. Illustratively, the two sub-pixel driving circuits 43 are arranged along the first direction; alternatively, the two sub-pixel driving circuits 43 are arranged along the second direction.

Illustratively, sub-pixel driving circuits 43 included in each display sub-pixel 40 in the second peripheral region 203 are distributed in an array; all the sub-pixel driving circuits 43 included in the display sub-pixel 40 in the second peripheral region 203 can be divided into a plurality of rows of sub-pixel driving circuits 43 and a plurality of columns of sub-pixel driving circuits 43; each row of sub-pixel driving circuits 43 shares the same scanning line; a plurality of columns of sub-pixel driving circuits 43 are divided into a plurality of groups of sub-pixel driving circuit 43 columns; each group of sub-pixel driving circuit 43 columns shares the same data line; each group of sub-pixel driving circuit 43 columns includes two columns of sub-pixel driving circuits 43, and in each group of sub-pixel driving circuit 43 columns, two sub-pixel driving circuits 43 located in the same row belong to the same display sub-pixel 40.

Illustratively, a plurality of groups of sub-pixel driving circuit 43 columns in the second peripheral region 203 have a one-to-one correspondence with some sub-pixel driving circuit 43 columns in the main display area 10, and each group of sub-pixel driving circuit 43 columns shares the same data line with a corresponding sub-pixel driving circuit 43 column in the main display area 10.

In the display substrate provided in the above-mentioned embodiment, by arranging the display sub-pixel 40 of the second peripheral region 203 to include two sub-pixel driving circuits 43 respectively coupled to the second anode pattern 73, a dual driving circuit drive of the display sub-pixel 40 of the second peripheral region 203 is realized, the light brightness of the second peripheral region 203 is closer to the light brightness of the main display area 10 and the light brightness of the transition area 30, reducing the brightness difference between the second peripheral region 203 and the main display area 10 and the transition area 30, and making the display brightness of the display substrate more uniform.

Figure 3:
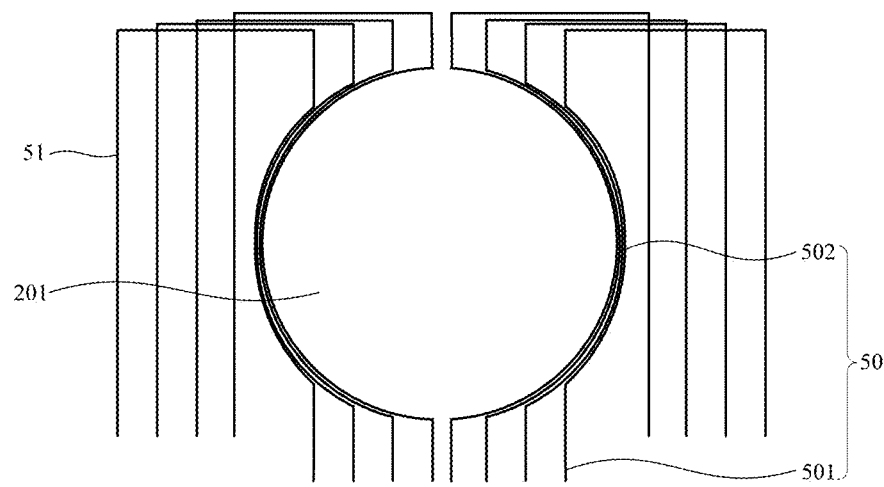
FIG. 3 is a schematic diagram of a compensation data line and a first data line in FIG. 1.

As shown in FIGS. 1 and 3, in some embodiments, the second peripheral region 203 is provided with a plurality of compensation data lines 51; the second virtual sub-pixel 42 includes a second virtual anode pattern 75, and two sub-pixel driving circuits 43 respectively coupled to the second virtual anode pattern 75, wherein the two sub-pixel driving circuits 43 are respectively coupled to the same scanning line, and the two sub-pixel driving circuits 43 are respectively coupled to the same compensation data line 51.

Illustratively, the second virtual sub-pixel 42 of the second peripheral region 203 includes a second virtual anode pattern 75, and two sub-pixel driving circuits 43 respectively coupled to the second virtual anode pattern 75, such as: two 7T1C circuits. Illustratively, the two sub-pixel driving circuits 43 are arranged along the first direction; alternatively, the two sub-pixel driving circuits 43 are arranged along the second direction.

Illustratively, the sub-pixel driving circuits 43 included by each display sub-pixel 40 in the second peripheral region 203 and the sub-pixel driving circuits 43 included by each virtual sub-pixel are distributed in an array; the sub-pixel driving circuits 43 included by each display sub-pixel 40 in the second peripheral region 203 and the sub-pixel driving circuits 43 included by each virtual sub-pixel can be divided into a plurality of rows of sub-pixel driving circuits 43 and a plurality of columns of sub-pixel driving circuits 43; each row of sub-pixel driving circuits 43 shares the same scanning line; two sub-pixel driving circuits 43 belonging to a display sub-pixel 40 and two sub-pixel driving circuits 43 belonging to a virtual sub-pixel are alternately distributed in each row of the sub-pixel driving circuits 43; and the sub-pixel driving circuits 43 belonging to a display sub-pixel 40 and the sub-pixel driving circuits 43 belonging to a virtual sub-pixel are alternately distributed in each column of the sub-pixel driving circuits 43.

Illustratively, the sub-pixel driving circuit 43 included by each virtual sub-pixel in the second peripheral region 203 can be divided into a plurality of columns of sub-pixel driving circuits 43; the plurality of columns of sub-pixel driving circuits 43 are divided into a plurality of groups of columns of sub-pixel driving circuits 43; each group of columns of sub-pixel driving circuits 43 shares the same compensation data line 51; each group of columns of sub-pixel driving circuits 43 includes two columns of sub-pixel driving circuits 43; and in each group of columns of sub-pixel driving circuits 43, two sub-pixel driving circuits 43 located in the same row belong to the same virtual sub-pixel.

In the display substrate provided by the above-mentioned embodiments, the layout of the display sub-pixels 40 and the virtual sub-pixels in the second peripheral region 203 are more uniform, which is beneficial to improve the display uniformity of the second peripheral region 203. Also, it is advantageous to reduce the layout difficulty of the display substrate by multiplexing the same scanning lines and compensating data lines 51.

As shown in FIGS. 1 to 4 and 10, in some embodiments, the display sub-pixel 40 of the aperture region 201 includes an aperture region anode pattern, the aperture region anode pattern have a one-to-one correspondence with the second virtual anode pattern 75 described in the first part, and the aperture region anode pattern is coupled to the corresponding second virtual anode pattern 75 by a corresponding first conductive connection part 60.

Illustratively, the display sub-pixel 40 of the aperture region only includes the aperture region anode pattern and does not include the sub-pixel driving circuit 43, so that the light transmittance of the aperture region is improved, and the camera disposed within the aperture region can collect light better.

Illustratively, the aperture region only includes the display sub-pixel 40 and does not include the virtual sub-pixel, so that the light transmittance of the aperture region can be improved.

Illustratively, the display sub-pixel 40 of the first color in the aperture region includes the same pixel opening as the display sub-pixel 40 of the first color in the transition area 30.

Illustratively, the display sub-pixel 40 of the first color in the aperture region includes an aperture region anode pattern having the same shape as the transition anode pattern 71 included in the display sub-pixel 40 of the first color in the transition area 30.

Illustratively, the aperture region anode pattern is coupled to the corresponding second virtual anode pattern 75 by the corresponding first conductive connection part 60, so that the aperture region anode pattern can be driven by the sub-pixel driving circuit 43 connected to the corresponding second virtual anode pattern 75. Illustratively, the aperture region anode pattern can be jointly driven by two sub-pixel driving circuits 43 connected to the corresponding second virtual anode pattern 75.

Illustratively, the aperture region anode pattern and the second virtual anode pattern 75 are disposed on the same layer and of the same material. Illustratively, both the aperture region anode pattern and the second virtual anode pattern 75 are made of the indium tin oxide (ITO) material. Illustratively, the first conductive connection part 60 is made of the indium tin oxide (ITO) material.

Illustratively, the first conductive connection part 60 is arranged in different layers with the second virtual anode pattern 75. Since the layout space of the display substrate is limited, this arrangement advantageously reduces the layout difficulty of the display substrate.

In the display substrate provided in the above-mentioned embodiment, by arranging the aperture region anode pattern coupled to the corresponding second virtual anode pattern 75 by the corresponding first conductive connection part 60, the aperture region anode pattern can be driven by the sub-pixel driving circuit 43 located in the second peripheral region 203, not only ensuring that the aperture region anode pattern can be driven well but also effectively improve the light transmittance of the aperture region.

Figure 4:
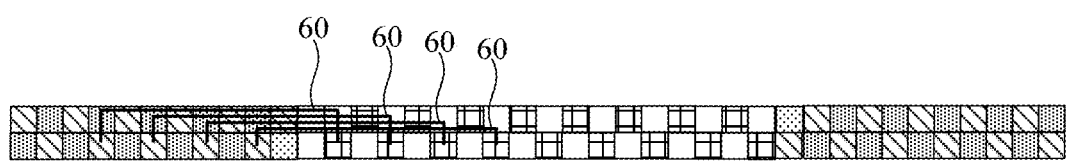
FIG. 4 is an enlarged schematic view of portion A in FIG. 1.

As shown in FIGS. 1 and 4, in some embodiments, the display sub-pixels 40 of the aperture region and the second virtual sub-pixels 42 of the second peripheral region 203 are divided into a plurality of rows of sub-pixels, each row of sub-pixels including at least one display sub-pixel 40 located in the aperture region and a plurality of the second virtual sub-pixels 42; the corresponding aperture region anode pattern and the second virtual anode pattern 75 belong to the same row of sub-pixels.

Illustratively, the display sub-pixels 40 of the aperture region and the second virtual sub-pixels 42 of the second peripheral region 203 are divided into a plurality of rows of sub-pixels, each row of sub-pixels includes at least one display sub-pixel 40 located in the aperture region, and a plurality of the second virtual sub-pixels 42 are arranged along the first direction.

Illustratively, in the display substrate, the distance between the corresponding aperture region anode pattern and the second virtual anode pattern 75 is substantially the same along the first direction.

Illustratively, in the display substrate, the number of sub-pixels spaced between the corresponding aperture region anode pattern and the second virtual anode pattern 75 is the same. Note that the spaced sub-pixels include at least one of the display sub-pixels 40 located in the aperture region, the display sub-pixels 40 located in the first peripheral region 202, the first virtual sub-pixels 41 (including the first virtual anode pattern 74), and the display sub-pixels 40 located in the second peripheral region 203, and the second virtual sub-pixels 42.

In the display substrate provided in the above-mentioned embodiment, by arranging the corresponding aperture region anode pattern and the second virtual anode pattern belong to the same row of sub-pixels, at least part of the first conductive connection part 60 for connecting the aperture region anode pattern and the second virtual anode pattern 75 can extend along the first direction, which is beneficial to the uniformity of the layout of the first conductive connection part 60 and is beneficial to reduce the layout difficulty of the first conductive connection part 60.

As shown in FIGS. 2 and 10, in some embodiments, the display sub-pixel 40 of the first peripheral region 202 includes a first anode pattern 72, the first anode pattern 72 have a one-to-one correspondence with the second virtual anode pattern 75 described in the second part, and the first anode pattern 72 is coupled to the corresponding second virtual anode pattern 75 by a corresponding first conductive connection part.

Illustratively, set up the display sub-pixel 40 of the first peripheral region 202 include a first anode pattern 72 and at least one sub-pixel driving circuit 43, the first anode pattern 72 not being coupled to the at least one sub-pixel driving circuit 43, i.e., the first anode pattern 72 does not receive driving signals provided by the at least one sub-pixel driving circuit 43. This arrangement advantageously reduces the layout difficulty of the display sub-pixels 40 of the first peripheral region 202.

Illustratively, the display sub-pixels 40 and the first virtual sub-pixels 41 of the first peripheral region 202 are uniformly distributed. Illustratively, in the first peripheral region 202, the display sub-pixels 40 and the first virtual sub-pixels 41 are alternately distributed along the first direction, and the display sub-pixels 40 and the first virtual sub-pixels 41 are alternately distributed along the second direction.

Illustratively, the display sub-pixel 40 of the first color in the first peripheral region 202 includes the same pixel opening as the display sub-pixel 40 of the first color in the transition area 30.

Illustratively, the display sub-pixel 40 of the first color in the first peripheral region 202 includes a first anode pattern 72 having the same shape as the transition anode pattern 71 included in the display sub-pixel 40 of the first color in the transition area 30.

Illustratively, the first anode pattern 72 is coupled to the corresponding second virtual anode pattern 75 by the corresponding first conductive connection part, so that the first anode pattern 72 can be driven by the sub-pixel driving circuit 43 connected to the corresponding second virtual anode pattern 75. Illustratively, the first anode pattern 72 can be jointly driven by two sub-pixel driving circuits 43 connected to the corresponding second virtual anode pattern 75.

Illustratively, the first anode pattern 72 and the second virtual anode pattern 75 are disposed on the same layer and of the same material. Illustratively, both the first anode pattern 72 and the second virtual anode pattern 75 are made of the indium tin oxide (ITO) material. Illustratively, the first conductive connection part is made of the indium tin oxide (ITO) material.

Illustratively, the first conductive connection part is arranged in different layers with the second virtual anode pattern 75. Since the layout space of the display substrate is limited, this arrangement advantageously reduces the layout difficulty of the display substrate.

In the display substrate provided in the above-mentioned embodiment, by arranging the first anode pattern 72 coupled to the corresponding second virtual anode pattern 75 by the corresponding first conductive connection part, the first anode pattern 72 can be driven by the sub-pixel driving circuit 43 located in the second peripheral region 203, not only ensuring that the first anode pattern 72 can be driven well but also effectively reducing layout difficulty of the sub-pixel of the first peripheral region 202.

In some embodiments, the display sub-pixels 40 of the first peripheral region 202 and the second virtual sub-pixels 42 of the second peripheral region 203 are divided into a plurality of rows of sub-pixels, each row of sub-pixels including at least one display sub-pixel 40 located in the first peripheral region 202 and a plurality of the second virtual sub-pixels 42; the corresponding first anode pattern 72 and the second virtual anode pattern 75 belong to the same row of sub-pixels.

Illustratively, the display sub-pixels 40 of the first peripheral region 202 and the second virtual sub-pixels 42 of the second peripheral region 203 are divided into a plurality of rows of sub-pixels, each row of sub-pixels includes at least one display sub-pixel 40 located in the first peripheral region 202, and a plurality of the second virtual sub-pixels 42 are arranged along the first direction.

Illustratively, in the display substrate, the distance between the corresponding first anode pattern 72 and the second virtual anode pattern 75 is substantially the same along the first direction.

Illustratively, in the display substrate, the number of sub-pixels spaced between the corresponding first anode pattern 72 and the second virtual anode pattern 75 is the same. Note that the spaced sub-pixels include at least one of the display sub-pixels 40 located in the first peripheral region 202, the first virtual sub-pixels 41 and the display sub-pixels 40 located in the second peripheral region 203, and the second virtual sub-pixels 42.

In the display substrate provided in the above-mentioned embodiment, by arranging the corresponding first anode pattern 72 and the second virtual anode pattern 75 belong to the same row of sub-pixels, at least part of the first conductive connection part 60 for connecting the first anode pattern 72 and the second virtual anode pattern 75 can extend along the first direction, which is beneficial to the uniformity of the layout of the first conductive connection part 60 and is beneficial to reduce the layout difficulty of the first conductive connection part 60.

Figure 5:
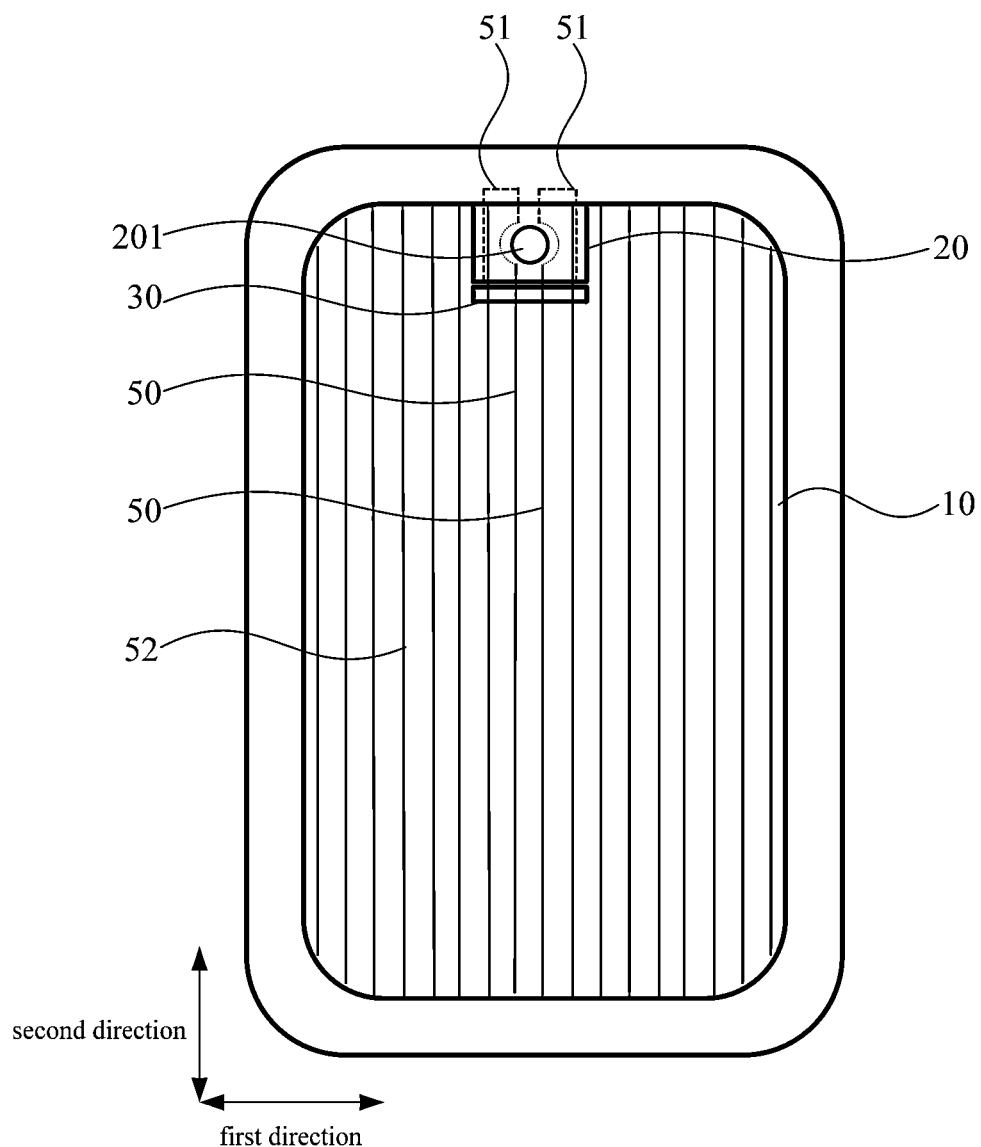
FIG. 5 is a schematic structural diagram of a display panel according to an embodiment of the present disclosure.

As shown in FIGS. 2, 3 and 5, in some embodiments, the plurality of data lines includes a plurality of first data lines 50;

the display sub-pixels 40 of the aperture region and the display sub-pixels 40 of the first peripheral region 202 are divided into a plurality of columns of first sub-pixel columns, and the plurality of columns of first sub-pixel columns have a one-to-one correspondence with the plurality of first data lines 50;

the second virtual sub-pixels 42 of the second peripheral region 203 are divided into a plurality of columns of second sub-pixel columns, and at least part of the plurality of columns of second sub-pixel columns have a one-to-one correspondence with the plurality of compensation data lines 51; and in the correspondingly coupled aperture region anode pattern and the second virtual anode pattern 75, a first data line 50 corresponding to a first sub-pixel column to which the aperture region anode pattern belongs is coupled to a compensation data line 51 corresponding to a second sub-pixel column to which the second virtual anode pattern 75 belongs.

Illustratively, the display sub-pixels 40 of the aperture region and the display sub-pixels 40 of the first peripheral region 202 are divided into a plurality of first sub-pixel columns, and the plurality of first sub-pixel columns have a one-to-one correspondence with the plurality of first data lines 50, and the first data lines 50 are used for providing data signals for the corresponding first sub-pixel columns.

Illustratively, the second virtual sub-pixels 42 of the second peripheral region 203 are divided into a plurality of second sub-pixel columns, at least part of the plurality of second sub-pixel columns have a one-to-one correspondence with the plurality of compensation data lines 51 for proving data signals to the corresponding second sub-pixel columns.

In the display substrate provided in the above-mentioned embodiments, in the correspondingly coupled aperture region anode pattern and the second virtual anode pattern 75, a first data line 50 corresponding to a first sub-pixel column to which the aperture region anode pattern belongs is coupled to a compensation data line 51 corresponding to a second sub-pixel column to which the second virtual anode pattern 75 belongs, ensuring the normal display of the display sub-pixels 40 of the aperture region, the display sub-pixels 40 of the first peripheral region 202 and the display sub-pixels 40 of the second peripheral region 203.

FIG. 14 is a schematic diagram showing a dual 7T1C sub-pixel driving circuit coupled to a data line according to an embodiment of the present disclosure. As shown in FIGS. 2, 3 and 5, in some embodiments, in the correspondingly coupled first anode pattern 72 and the second virtual anode pattern 75, a first data line 50 corresponding to a first sub-pixel column to which the first anode pattern 72 belongs is coupled with a compensation data line 51 corresponding to a second sub-pixel column to which the second virtual anode pattern 75 belongs.

In the display substrate provided in the above-mentioned embodiments, in the correspondingly coupled first anode pattern 72 and the second virtual anode pattern 75, a first data line 50 corresponding to a first sub-pixel column to which the first anode pattern 72 belongs is coupled to a compensation data line 51 corresponding to a second sub-pixel column to which the second virtual anode pattern 75 belongs, ensuring the normal display of the display sub-pixels 40 of the aperture region, the display sub-pixels 40 of the first peripheral region 202 and the display sub-pixels 40 of the second peripheral region 203.

As shown in FIG. 3, in some embodiments, the first data line 50 includes a straight edge portion 501 and a curved edge portion 502, and at least part of the straight edge portion 501 is located in the main display area 10, and the curved edge portion 502 is located in the first peripheral region 202, and at least part of the curved edge portion 502 extends along part of the boundary of the aperture region.

Illustratively, at least part of the straight edge portion 501 extends along the second direction and at least part of the curved edge portion 502 extends along a partial boundary of the aperture region.

Illustratively, at least part of the straight portion 501 is located in the main display area 10 for providing data signals to the corresponding display sub-pixels 40 in the main display area 10.

Illustratively, the display substrate includes an active layer, a first gate insulating layer, a first gate metal layer, a second gate insulating layer, a second gate metal layer, an interlayer insulating layer, a first source drain metal layer, a passivating layer, a planarization layer, an anode layer, a pixel defining layer, a light emitting functional layer and a cathode, which are arranged in a stacked order in a direction away from a base.

Illustratively, the straight edge portion 501 is manufactured using the first source drain metal layer and the curved edge portion 502 is manufactured using the first gate metal layer.

Illustratively, the straight edge portion 501 is manufactured using the first source drain metal layer and the curved edge portion 502 is manufactured using the second gate metal layer.

Illustratively, the straight edge portion 501 and the curved edge portion 502 are formed as an integral structure.

Illustratively, the straight edge portion 501 and the curved edge portion 502 are arranged in different layers, and the straight edge portion 501 and the curved edge portion 502 are connected through a hole.

Illustratively, the compensation data line 51 is made of a first source drain metal layer; alternatively, the compensation data line 51 is made of a second source drain metal layer.

Illustratively, the compensation data line 51 and the curved edge portion 502 are arranged in different layers, and the compensation data line 51 and the corresponding curved edge portion 502 are connected through a hole.

As shown in FIG. 10, in some embodiments, the display sub-pixel 40 of the first peripheral region 202 includes a first anode pattern 72, and two sub-pixel driving circuits 43 respectively coupled to the first anode pattern 72, wherein the two sub-pixel driving circuits 43 are respectively coupled to the same scanning line, and the two sub-pixel driving circuits 43 are respectively coupled to the same data line.

Illustratively, the display sub-pixel 40 of the first peripheral region 202 includes a first anode pattern 72 and two sub-pixel driving circuits 43, both of which are coupled to the first anode pattern 72, for providing driving signals to the first anode pattern 72. Illustratively, the two sub-pixel driving circuits 43 include two 7T1C circuits. Illustratively, the two sub-pixel driving circuits 43 are arranged along the first direction; alternatively, the two sub-pixel driving circuits 43 are arranged along the second direction.

Illustratively, the sub-pixel driving circuits 43 included in each display sub-pixel 40 in the first peripheral region 202 are distributed in an array; all the sub-pixel driving circuits 43 included in the display sub-pixel 40 in the first peripheral region 202 can be divided into a plurality of rows of sub-pixel driving circuits 43 and a plurality of columns of sub-pixel driving circuits 43; each row of sub-pixel driving circuits 43 shares the same scanning line; the plurality of columns of sub-pixel driving circuits 43 are divided into a plurality of groups of sub-pixel driving circuit 43 columns; each group of sub-pixel driving circuit 43 columns shares the same data line; each group of sub-pixel driving circuit 43 columns includes two columns of sub-pixel driving circuits 43, and in each group of sub-pixel driving circuit 43 columns, two sub-pixel driving circuits 43 located in the same row belong to the same display sub-pixel 40.

Illustratively, a plurality of groups of sub-pixel driving circuit 43 columns in the first peripheral region 202 have a one-to-one correspondence with some sub-pixel driving circuit 43 columns in the main display area 10, and each group of sub-pixel driving circuit 43 columns shares the same data line with a corresponding sub-pixel driving circuit 43 column in the main display area 10.

In the display substrate provided by the above-mentioned embodiment, by arranging the display sub-pixel 40 of the first peripheral region 202 include a first anode pattern 72, and two sub-pixel driving circuits 43 respectively coupled to the first anode pattern 72, the display sub-pixel 40 located at the first peripheral region 202 can be driven by the driving circuit belonging thereto without being connected to the second virtual anode pattern 75 by the first conductive connection part 60, thereby reducing the complexity of the layout of the display substrate and reducing the manufacturing cost of the display substrate.

Figure 6:
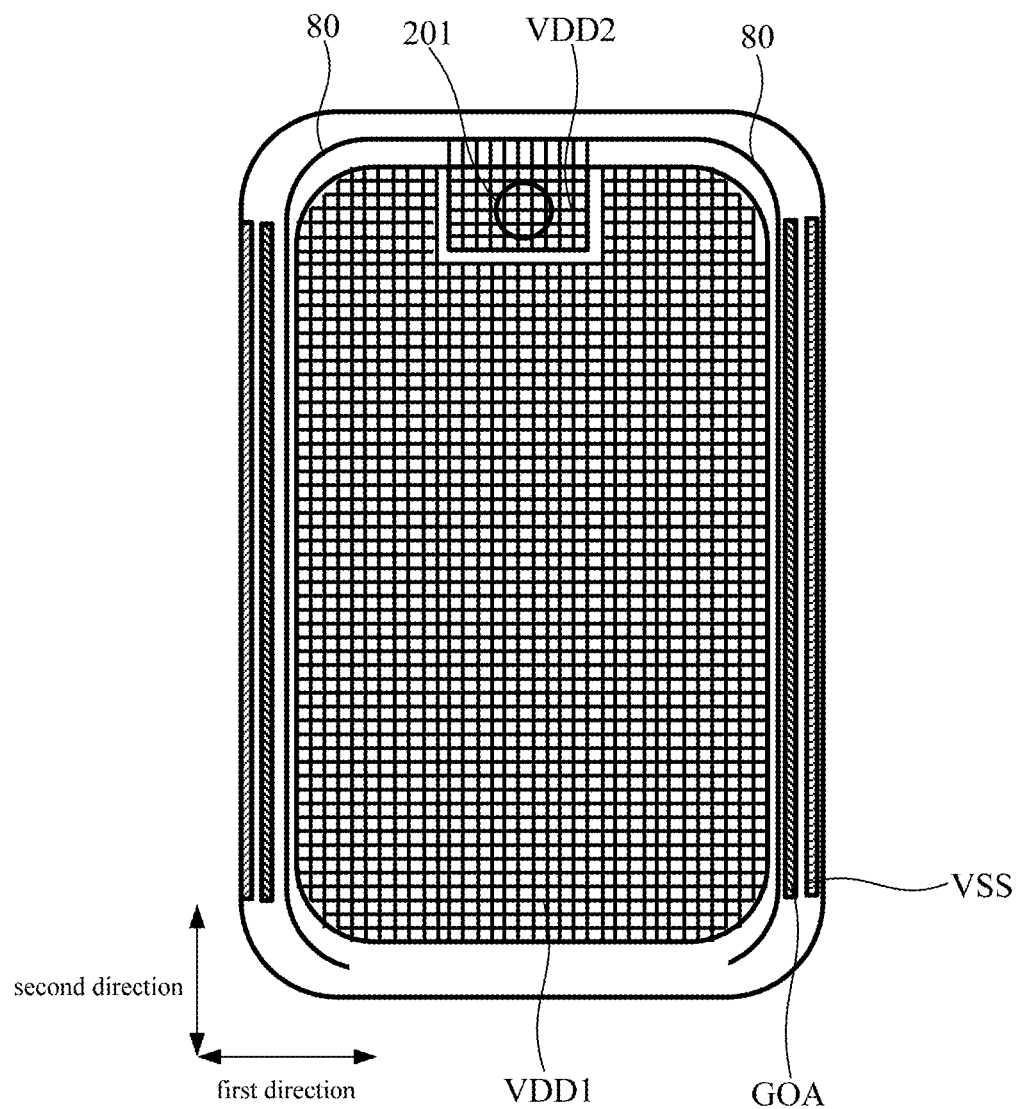
FIG. 6 is a schematic diagram of a first power pattern and a second power pattern according to an embodiment of the present disclosure.

As shown in FIG. 6, in some embodiments, the display substrate further includes:

A meshed first power supply pattern VDD1, wherein the first power supply pattern VDD1 includes a portion located in the main display area 10;

A meshed second power supply pattern VDD2, wherein the second power supply pattern VDD2 includes a portion located at the first peripheral region 202, a portion located at the second peripheral region 203 and a portion located at the transition area 30.

Illustratively, the first power supply pattern VDD1 and the second power supply pattern VDD2 are used to provide power signals to corresponding sub-pixel driving circuits 43 in the display substrate.

Illustratively, the first power supply pattern VDD1 and the second power supply pattern VDD2 are independent of each other. Illustratively, the first power supply pattern VDD1 and the second power supply pattern VDD2 are respectively coupled to a chip in a display substrate, and the chip respectively provides power supply signals for the first power supply pattern VDD1 and the second power supply pattern VDD2.

Illustratively, the second power supply pattern VDD2 further includes at least one extension 80, at least part of which is located between a display area of the display substrate and a gate driving circuit (GOA), the extension 80 being capable of extending to the vicinity of a chip along a frame of the display substrate and being coupled to the driver chip. Note that the negative power supply line VSS is also shown in FIG. 6.

Illustratively, the first power supply pattern VDD1 is loaded with a first power signal and the second power supply pattern VDD2 is loaded with a second power signal, the first power signal being less than or equal to the second power signal. Illustratively, the voltage range of the first power signal is between 2V and 4V and may include endpoint values. Illustratively, the voltage range of the second power signal is between 2.5 v and 4.5 v and may include endpoint values.

By setting the first power supply signal to be less than or equal to the second power supply signal, the display brightness of the display sub-pixel 40 in the aperture region, the display brightness of the display sub-pixel 40 in the first peripheral region 202, the display brightness of the display sub-pixel 40 in the second peripheral region 203 and the display brightness of the display sub-pixel 40 in the transition area 30 can be enhanced, so as to effectively improve the brightness uniformity of the whole display substrate and weaken the brightness difference of each region at the boundary line.

Embodiments of the present disclosure also provide a display device including the display substrate provided by the above embodiments.

In the display substrate provided in the embodiments of the present disclosure, by arranging that at least part of the transition area 30 located between the main display area 10 and the second peripheral region 203, the density of the display sub-pixels 40 of the transition area 30 is less than the density of the display sub-pixels 40 of the main display area 10, and the density of the display sub-pixels 40 of the transition area 30 is greater than the density of the display sub-pixels 40 of the secondary display area 20, a display brightness transition region is formed between the main display area 10 and the secondary display area 20 and the problem that the difference in light brightness is noticeable at the boundary of the secondary display area 20 and the main display area 10 is improved, therefore the display substrate achieves a more uniform and transitional full-screen visual display effect, and achieves a better full-screen display effect and user experience.

The display device provided by the embodiments of the present disclosure also has the above-mentioned intentional effects when including the above-mentioned display substrate, and will not be described in detail herein.

Note that the display device may be: any product or component with display function such as television, display, digital photo frame, mobile phone and tablet computer. Illustratively, the display device includes an organic light emitting diode display device.

The embodiments of the present disclosure also provide a manufacturing method of a display substrate, and the display substrate includes a main display area 10, a secondary display area 20, and a transition area 30; the secondary display area 20 includes an aperture region, a first peripheral region 202 and a second peripheral region 203, and at least part of the first peripheral region 202 is located between the aperture region and the second peripheral region 203; and the manufacturing method includes:

manufacturing a display sub-pixel 40 in the aperture region; manufacturing a display sub-pixel 40 and a first virtual sub-pixel 41 in the first peripheral region 202; manufacturing a display sub-pixel 40 and a second virtual sub-pixel 42 in the second peripheral region 203; the density of the display sub-pixels 40 of the aperture region, the density of the display sub-pixels 40 of the first peripheral region 202 and the density of the display sub-pixels 40 of the second peripheral region 203 are the same; and at least part of the transition area 30 is located between the main display area 10 and the second peripheral region 203; the main display area 10 and the transition area 30 each include a display sub-pixel 40, and the density of the display sub-pixels 40 of the transition area 30 is less than the density of the display sub-pixels 40 of the main display area 10, and the density of the display sub-pixels 40 of the transition area 30 is greater than the density of the display sub-pixels 40 of the secondary display area 20.

Illustratively, the display substrate has a square shape, including an upper frame, a lower frame, a left frame, and a right frame. The secondary display area 20 is integrally located at a position close to the upper frame, or the secondary display area 20 is integrally located at a position close to the upper left corner of the display substrate, or the secondary display area 20 is integrally located at a position close to the upper right corner of the display substrate. Illustratively, in the whole display interface of the display substrate, the main display area 10 is complementary to the secondary display area 20, namely, in the whole display interface, all the remaining areas except the area where the secondary display area 20 is located are the main display area 10.

Illustratively, the main display area 10 is used as the main display area of a display substrate for realizing the main display function of the display substrate, for example: displaying images, and displaying video pictures, etc. The secondary display area 20 serves as the secondary display area of a display substrate, and the secondary display area 20 can fit the main display area 10 to complete the display of a full picture and a full video, and can also independently display time, mobile network connection situation and electric quantity, etc.

Illustratively, the secondary display area 20 includes an aperture region 201, and the orthographic projection of the aperture region on the base of the display substrate is a circle or an ellipse. Illustratively, the display substrate includes a camera structure, such as a camera; and the camera structure is disposed within the aperture region.

Illustratively, the aperture region includes the display sub-pixel 40, and the display sub-pixel 40 located in the aperture region only includes the aperture region anode pattern and does not include the sub-pixel driving circuit 43. Since the aperture region anode pattern can transmit light, and the aperture region is not blocked by the sub-pixel driving circuit 43, thus the collection of light of the camera structure located in the aperture region is well ensured, and the photographing quality of the camera structure is ensured.

Illustratively, the density of the display sub-pixels 40 of the aperture region, the density of the display sub-pixels 40 of the first peripheral region 202, and the density of the display sub-pixels 40 of the second peripheral region 203 are the same, ensuring the uniformity of the display brightness of the secondary display area 20, such that there is no noticeable brightness difference at the boundary between the aperture region, the first peripheral region 202 and the second peripheral region 203.

Illustratively, the main display area 10 is also referred to as a high PPI display area, and the secondary display area 20 is also referred to as a low PPI display area, and the aperture region 201 is also referred to as a camera area.

In the display substrate provided in the embodiments of the present disclosure, by arranging that at least part of the transition area 30 located between the main display area 10 and the second peripheral region 203, the density of the display sub-pixels 40 of the transition area 30 is less than the density of the display sub-pixels 40 of the main display area 10, and the density of the display sub-pixels 40 of the transition area 30 is greater than the density of the display sub-pixels 40 of the secondary display area 20, a display brightness transition region is formed between the main display area 10 and the secondary display area 20 and the problem that the difference in light brightness is noticeable at the boundary of the secondary display area 20 and the main display area 10 is improved, therefore the display substrate achieves a more uniform and transitional full-screen visual display effect, and achieves a better full-screen display effect and user experience.

It should be noted that the various embodiments herein are described in a progressive manner, and the same and similar parts among all embodiments can be referred to each other. Each embodiment focuses on the differences with other embodiments. In particular, for method embodiments, because they are basically similar to product embodiments, the description is relatively simple. Please refer to the part of product embodiments for relevant information.

Unless defined otherwise, technical or scientific terms used in the present disclosure should have the ordinary meaning as understood by persons of ordinary skill in the art to which the present disclosure belongs. The use of "first", "second", and the like in the present disclosure does not denote any order, quantity, or importance, but is used to distinguish one element from another. The word "comprising" or "comprises", and the like means that the presence of an element or item preceding the word covers the presence of the element or item listed after the word and equivalents thereof, but does not exclude other elements or items. The terms "linked", "coupled", or "connected", and the like, are not limited to physical or mechanical connections, but may include electrical connections, whether direct or indirect. The terms "upper", "lower", "left", "right", and the like are used only to indicate relative positional relationships that may change accordingly when the absolute position of the object being described changes.

It may be understood that when an element such as a layer, film, region or substrate is referred to as being "on" or "under" another element, it can be "directly on" or "directly under" the other element or middle element may be present.

In the description of the embodiments above, particular features, structures, materials, or characteristics may be combined in any suitable manner in any one or more embodiments or examples.

While the foregoing is directed to embodiments of the present disclosure, other and further embodiments of the present disclosure may be devised without departing from the basic scope thereof, and the scope thereof is determined by the claims that follow. Therefore, the scope of protection disclosed herein should be subject to the scope of protection stated in the claims.

What is claimed is:

1. A display substrate, comprising a main display area, a secondary display area, and a transition area; the secondary display area comprising an aperture region, a first peripheral region and a second peripheral region, and at least part of the first peripheral region being located between the aperture region and the second peripheral region;

the aperture region comprising a display sub-pixel; the first peripheral region comprising a display sub-pixel and a first virtual sub-pixel; the second peripheral region comprising a display sub-pixel and a second virtual sub-pixel; a density of the display sub-pixels of the aperture region, the density of the display sub-pixels of the first peripheral region and the density of the display sub-pixels of the second peripheral region being the same; and at least part of the transition area being located between the main display area and the second peripheral region; the main display area and the transition area both comprising display sub-pixels, the density of the display sub-pixels of the transition area being less than the density of the display sub-pixels of the main display area, and the density of the display sub-pixels of the transition area being greater than the density of the display sub-pixels of the secondary display area;

wherein the display substrate further comprises a plurality of scanning lines and a plurality of data lines; at least part of the scanning line extends along the first direction, and at least part of the data line extends along a second direction, and the second direction intersects with the first direction;

a display sub-pixel of the main display area comprises a main anode, and a sub-pixel driving circuit coupled to the main anode;

a display sub-pixel of the transition area comprises a transition anode, and at least one sub-pixel driving circuit coupled to the transition anode; and a display sub-pixel of the second peripheral region comprises a second anode, and at least one sub-pixel driving circuit coupled to the second anode;

wherein the display sub-pixel of the second peripheral region comprises two sub-pixel driving circuits respectively coupled to the second anode, the two sub-pixel driving circuits are respectively coupled to the same scanning line, and the two sub-pixel driving circuits are respectively coupled to the same data line.

2. The display substrate according to claim 1, wherein the first peripheral region surrounds at least part of the aperture region;

the second peripheral region comprises a first sub-region and a second sub-region oppositely arranged along a first direction, and the first peripheral region is located between the first sub-region and the second sub-region; and at least part of the transition area is located between the main display area and the first peripheral region.

3. The display substrate according to claim 1, wherein the second peripheral region surrounds the aperture region and the first peripheral region.

4. The display substrate according to claim 2, wherein along a second direction, the main display area is located at one side of the secondary display area, and the second direction intersects the first direction; and the main display area surrounds the secondary display area.

5. The display substrate according to claim 1, wherein the display sub-pixel of the transition area comprises two sub-pixel driving circuits respectively coupled to the transition anode, the two sub-pixel driving circuits are respectively coupled to the same scanning line, and the two sub-pixel driving circuits are respectively coupled to the same data line.

6. The display substrate according to claim 1, wherein the second peripheral region is provided with a plurality of compensation data lines; the second virtual sub-pixel comprises a second virtual anode, and two sub-pixel driving circuits respectively coupled to the second virtual anode, wherein the two sub-pixel driving circuits are respectively coupled to the same scanning line, and the two sub-pixel driving circuits are respectively coupled to the same compensation data line.

7. The display substrate according to claim 6, wherein the display sub-pixel of the aperture region comprises an aperture region anode, the aperture region anode has a one-to-one correspondence with the second virtual anode, and the aperture region anode is coupled to a corresponding second virtual anode by a corresponding first conductive connection part; and the first conductive connection part is arranged in different layers with the second virtual anode.

8. The display substrate according to claim 7, wherein the display sub-pixel of the aperture region and the second virtual sub-pixel of the second peripheral region are divided into a plurality of rows of sub-pixels, and each row of sub-pixels comprises at least one display sub-pixel located in the aperture region and a plurality of the second virtual sub-pixels; and a pair of the aperture region anode and the second virtual anode corresponding to each other belong to the same row of sub-pixels.

9. The display substrate according to claim 7, wherein the display sub-pixel of the first peripheral region comprises a first anode, the first anode has a one-to-one correspondence with the second virtual anode, and the first anode is coupled to a corresponding second virtual anode by a corresponding first conductive connection part.

10. The display substrate according to claim 9, wherein the display sub-pixel of the first peripheral region and the second virtual sub-pixel of the second peripheral region are divided into a plurality of rows of sub-pixels, and each row of sub-pixels comprises at least one display sub-pixel located in the first peripheral region and a plurality of the second virtual sub-pixels; and a pair of the first anode and the second virtual anode corresponding to each other belong to the same row of sub-pixels.

11. The display substrate according to claim 9, wherein the plurality of data lines comprises a plurality of first data lines; the display sub-pixels of the aperture region and the display sub-pixels of the first peripheral region are divided into a plurality of first sub-pixel columns, and the plurality of first sub-pixel columns have a one-to-one correspondence with the plurality of first data lines; the second virtual sub-pixels of the second peripheral region are divided into a plurality of second sub-pixel columns, and at least part of the plurality of second sub-pixel columns have a one-to-one correspondence with the plurality of compensation data lines; and in a pair of the aperture region anode and the second virtual anode correspondingly coupled, a first data line corresponding to a first sub-pixel column to which the aperture region anode belongs is coupled to a compensation data line corresponding to a second sub-pixel column to which the second virtual anode belongs.

12. The display substrate according to claim 11, wherein in a pair of the first anode and the second virtual anode correspondingly coupled, a first data line corresponding to a first sub-pixel column to which the first anode belongs is coupled to a compensation data line corresponding to a second sub-pixel column to which the second virtual anode belongs.

13. The display substrate according to claim 11, wherein the first data line comprises a straight edge portion and a curved edge portion, and at least part of the straight edge portion is located in the main display area, and the curved edge portion is located in the first peripheral region, and at least part of the curved edge portion extends along part of a boundary of the aperture region.

14. The display substrate according to claim 1, wherein the display sub-pixel of the first peripheral region comprises a first anode, and two sub-pixel driving circuits respectively coupled to the first anode, and the two sub-pixel driving circuits are respectively coupled to the same scanning line, and the two sub-pixel driving circuits are respectively coupled to the same data line.

15. The display substrate according to claim 1, wherein the display substrate further comprises:
a first power pattern having a mesh shape, the first power pattern comprising a portion located in the main display area; and
a second power pattern having a mesh shape, the second power pattern comprising a portion located in the first peripheral region, a portion located in the second peripheral region, and a portion located in the transition area.

16. The display substrate according to claim 1, wherein the density of the display sub-pixels of the transition area is twice the density of the display sub-pixels of the secondary display area; and the density of the display sub-pixels of the main display area is twice the density of the display sub-pixels of the transition area.

17. The display substrate according to claim 1, wherein the display sub-pixel of the transition area, the display sub-pixel of the aperture region, the display sub-pixel of the first peripheral region, and the display sub-pixel of the second peripheral region each comprise a first pixel opening, and an orthographic projection of the first pixel opening on a base of the display substrate is an ellipse with notched edges.

18. The display substrate according to claim 1, wherein the display sub-pixel of the main display area comprises a second pixel opening, an orthographic projection of the second pixel opening on a base of the display substrate is a pentagon or a hexagon.

* * * * *